United States Patent
Li et al.

(10) Patent No.: US 10,269,991 B2
(45) Date of Patent: Apr. 23, 2019

(54) METHOD OF PATTERNING A LAYER

(71) Applicant: NEWSOUTH INNOVATIONS PTY LIMITED, Sydney, New South Wales (AU)

(72) Inventors: Zhongtian Li, Chatswood (AU); Alison Joan Lennon, Rozelle (AU)

(73) Assignee: NewSouth Innovations Pty Limited, Sydney, New South Wales (AU)

( * ) Notice: Subject to any disclaimer, the term of this patent is extended or adjusted under 35 U.S.C. 154(b) by 132 days.

(21) Appl. No.: 15/517,156

(22) PCT Filed: Oct. 7, 2015

(86) PCT No.: PCT/AU2015/000602
§ 371 (c)(1),
(2) Date: Apr. 5, 2017

(87) PCT Pub. No.: WO2016/054677
PCT Pub. Date: Apr. 14, 2016

(65) Prior Publication Data
US 2017/0243991 A1 Aug. 24, 2017

(30) Foreign Application Priority Data
Oct. 7, 2014 (AU) .............................. 2014903995

(51) Int. Cl.
G03F 7/16 (2006.01)
G03F 7/20 (2006.01)
G03F 7/32 (2006.01)
C09D 11/30 (2014.01)
C09D 11/52 (2014.01)
(Continued)

(52) U.S. Cl.
CPC ...... *H01L 31/022425* (2013.01); *C09D 11/30* (2013.01); *C09D 11/52* (2013.01); *G03F 7/0382* (2013.01); *G03F 7/162* (2013.01); *G03F 7/168* (2013.01); *G03F 7/2004* (2013.01); *G03F 7/322* (2013.01); *H01L 51/0019* (2013.01); *Y02E 10/50* (2013.01)

(58) Field of Classification Search
CPC .................. H01L 51/0019; H01L 31/022425
See application file for complete search history.

(56) References Cited

U.S. PATENT DOCUMENTS 6,362,079 B1 3/2002 Iwata et al.
6,576,394 B1 6/2003 Xu et al.
(Continued)

FOREIGN PATENT DOCUMENTS

EP 2709160 3/2014

OTHER PUBLICATIONS

International Search Report and Written Opinion for Application No. PCT/AU2015/000602 dated Dec. 17, 2015 (11 pages).

*Primary Examiner* — Amar Movva
(74) *Attorney, Agent, or Firm* — Michael Best & Friedrich LLP (57) ABSTRACT

The present disclosure provides a method of patterning a polymeric layer based on the chemical reaction of two chemical compounds. One chemical compound is provided in the polymeric layer and another chemical compound is deposited on the polymeric layer by, for example, ink-jet printing. The method allows for fabrication of, for example, metallization patterns for solar cells electronic components, integrated devices and formation of selective doped areas in solar cells amongst others.

20 Claims, 4 Drawing Sheets

(51) Int. Cl.
    *G03F 7/038*     (2006.01)
    *H01L 51/00*     (2006.01)
    *H01L 31/0224*     (2006.01)

(56) References Cited

U.S. PATENT DOCUMENTS

2006/0292821 A1     12/2006   Young
2007/0006727 A1      1/2007   Young et al.
2010/0047721 A1      2/2010   Wenham et al.

METHOD OF PATTERNING A LAYER

FIELD OF THE INVENTION

The present invention generally relates to a method of patterning a layer, in particular the invention relates to a method of patterning a polymeric layer containing a resist material.

BACKGROUND OF THE INVENTION

Patterning of polymeric layers is a crucial step in the manufacturing of microelectronic devices. For example, integrated electronic circuits are manufactured using a plurality of photolithography steps performed in sequence to form features of electronic components on chip. Each of these lithography steps involves the exposure of a polymeric photosensitive layer (photoresist) to a ultra-violet (UV) light through a chromium photomask and the chemical development of the photoresist layer. The process allows transferring a pattern from the mask to the photoresist.

This process allows creating high definition patterns in a photoresist layer which can be used, for example, to selectively deposit a metal line or implant dopant atoms. The process also allows to precisely aligning the pattern with features already present on the integrated circuit.

Photolithography steps have also been used to fabricate high efficiency laboratory solar cells, such as the PERL solar cell at the University of New South Wales, and the A300 solar cell at the University of Stanford. Despite the record results of these solar cells, photolithography is not a viable solution for the production of commercial solar cells.

The cost of photomasks and the photoresist material does not comply with the low cost requirement of the solar cell manufacturing industry. In addition, the time required for aligning the photomasks to the devices, exposing and developing the photoresist does not comply with the high throughput requirement of modern solar cell manufacturing lines.

A patterning step may be used at different stages of the solar cell manufacturing process. For example, a patterning step may be required to selective deposit a metal to form conductive fingers on a surface of a solar cell. A patterning step may be also used in many other applications, for example, the deposition of protecting coatings on glass substrates, the formation of conductive patterns on electronic boards, etc.

These applications generally do not require the resolution and alignment precision typical of the photolithography techniques used in the microelectronic industry.

There is a need for a method which can be used to pattern a polymeric layer which allows for a higher throughput and has a lower cost than conventional photolithography.

SUMMARY OF THE INVENTION

In accordance with the first aspect, the present invention provides a method of patterning a polymeric layer, the method comprising the steps of:
providing a layer comprising a polymeric material and a first reagent;
exposing a portion of the layer to a chemical compound comprising a second reagent; and thereafter
exposing the layer to a developer solution;
wherein the first reagent of the layer reacts with the second reagent of the chemical compound to alter the chemical properties of the exposed portion of the layer in a manner such that the solubility of the polymeric material in the developer solution at the exposed portion is increased or decreased.

In embodiments, the polymeric material at the exposed portion of the layer is substantially dissolvable in the developer solution or substantially resistant to the developer solution.

The method may also comprise the step of processing the polymeric layer so that the chemical properties of a portion of the layer that has not been exposed to the chemical compound comprising the second reagent are altered in a manner such that the solubility of the polymeric material in the developer solution is increased or decreased.

The step of processing the polymeric layer may comprise the step of baking the layer at a temperature between 90° C. and 150° C. for a time between 10 seconds and 3 minutes.

Depending on the function of the baking step, in some instances, the step of processing the polymeric layer may comprise baking the layer for a period longer than 3 minutes. The duration of the baking treatment may be related to whether the layer is used as an etching mask or as a plating mask.

In some embodiments, the thermal treatment comprises blow drying the layer.

In some embodiments, the chemical compound is provided in the form of a fluid and the portion of the layer is exposed to the second reagent by depositing the chemical compound comprising a second reagent onto a surface of the portion of the layer. The chemical compound may be provided in the form of an ink comprising the second reagent and the ink may be deposited on the surface portion of the layer using an ink-jet deposition technology, an aerosol deposition technique or a screen-printing technique.

In embodiments, the exposed portion of the layer extends throughout the entire thickness of the layer and may define a pattern comprising a plurality of elongated openings in the layer. The pattern may form a solar cell metallization pattern.

In embodiments, the first reagent is an acidic reagent with a hydrogen ion activity between 1 and $10^{-4}$ and the second reagent has a hydrogen ion activity between $10^{-4}$ and $10^{-14}$. In some instances, the first reagent has a hydrogen ion activity between 1 and $10^{-2}$ and the second reagent has a hydrogen ion activity between $10^{-7}$ and $10^{-9}$.

In embodiments, the hydrogen ion activity of the first reagent is selected to affect the velocity of the reaction between the first reagent and the second reagent. The first reagent may be an acidic reagent and the second reagent a basic reagent.

In embodiments, the polymeric layer comprises a photoresist material or a chemically amplified photoresist material. The chemical amplified photoresist may comprise a negative melamine formaldehyde resin (MFR). The photoresist material may be mixed with an acidic solution, which may be an organic acidic solution. The hydrogen ion activity of the solution may be between 1 and $10^{-4}$.

In embodiments, the polymeric layer comprises a cross-linker molecule and a resin arranged to cross-link to each other when exposed to sufficient thermal energy.

The cross-linker molecule may comprise melamine formaldehyde and the resin may comprise a novolac polymer.

In embodiments, the chemical compound comprising the second reagent further comprises one or a combination of:
a plasticiser for improving mixing of the chemical compound through the portion of the layer;
a surfactant for improving penetration of the chemical compound through the portion of the layer; or one or more buffering agents for controlling the PH and improve the efficiency of the reaction between the polymeric material and the second reagent.

The chemical composition of the one or more buffering agents may be such that the hydrogen ion activity of the portion of the layer exposed to the chemical compound comprising the second reagent is higher than $10^{-4}$ after the portion has been exposed.

Furthermore, the chemical compound comprising the second reagent may comprise an organic solvent to promote chemical reaction with the layer comprising the polymeric material and precise PH control throughout the thickness of the layer.

In embodiments, the step of exposing the layer and the chemical compound to a developer solution comprises immersing the layer in a developer solution for a time period between 1 second and 300 seconds.

In accordance with the second aspect, the present invention provides a method of forming a patterned metallic layer on a surface of a device, the method comprising the steps of:
  forming a layer comprising a polymeric material on the surface of the device;
  patterning a portion of the formed layer using the method in accordance with the first aspect to form one or more openings in the layer; and
  forming a metallic layer onto a first portion of the surface of the device through the one or more openings formed in the layer.

In accordance with the third aspect, the present invention provides a method of selectively etching a surface of a device, the method comprising the steps of:
  forming a layer comprising a polymeric material on the surface of the device;
  patterning a portion of the formed layer using the method in accordance with the first aspect to form one or more openings in the layer; and
  performing an etching treatment onto a first portion of the surface of the device through the one or more openings formed in the layer.

In accordance with the fourth aspect, the present invention provides a method of anodising a surface of a device, the method comprising the steps of:
  forming a layer comprising a polymeric material on the surface of the device;
  patterning a portion of the layer using the method in accordance with the first aspect to form one or more openings in the layer;
  exposing a first surface portion of the device through the one or more of the openings to an electrolytic solution that is suitable for anodising the first surface portion when an electrical current is directed through a region of the device at the first surface portion; and
  exposing a portion of the device to electromagnetic radiation in a manner such that the electromagnetic radiation induces the electrical current and the first surface portion anodises.

In accordance with the fifth aspect, the present invention provides a semiconductor device comprising a patterned metallic layer formed in accordance with the second aspect, or a surface selectively etched in accordance with the third aspect, or a surface anodised in accordance with the fourth aspect.

In accordance with the sixth aspect, the present invention provides a solar cell device comprising a patterned metallic layer formed in accordance with the second aspect, or a surface selectively etched in accordance with the third aspect, or a surface anodised in accordance with the fourth aspect.

In accordance with the seventh aspect, the present invention provides a method of forming a solar cell device, the method comprising the step of:
  providing a substrate having a first polarity;
  depositing a first layer having a second polarity in a manner such that the layer forms a p-n junction or a p-i-n junction with the substrate;
  depositing a second layer on at least a portion of the first layer and;
  forming patterned metallic layer on the second layer in accordance with the method of the second aspect.

In accordance with the eighth aspect, the present invention provides a solar cell device formed in accordance with the seventh aspect.

Advantageous embodiments of the present invention provide a method of patterning a polymeric layer which is based on the chemical reaction of two chemical compounds. One chemical compound is provided in the polymeric layer and another chemical compound is deposited on the polymeric layer by, for example, ink-jet printing. Embodiments of the method allow for fabrication of, for example, high-definition metallisation patterns for solar cells without having to use photolithography which is not a viable technique for solar cell fabrication.

Other applications of embodiments of the method include fabrication of electronic components, integrated devices and formation of selective doped areas in solar cells amongst others. The method may also be used, for example, to selectively treat or paint a surface through the openings which are formed in the polymeric layer. Generally the method can be used to replace photolithography where a very high resolution is not required and where the cost of photolithography cannot be justified. The method in fact, does not involve the exposure of the polymeric layer to UV light through a mask. This is particularly suitable, for example, to the fabrication of several types of solar cells.

BRIEF DESCRIPTION OF THE DRAWINGS

Features and advantages of the present invention will become apparent from the following description of embodiments thereof, by way of example only, with reference to the accompanying drawings in which.

DETAILED DESCRIPTION OF EMBODIMENTS

Embodiments of the present invention relate to a method of patterning a polymeric layer. The method allows patterning a layer comprising a polymeric material using inexpensive techniques, such as ink-jet printing. The polymeric layer contains a first reagent, a portion of the polymeric layer is exposed to a chemical compound which contains a second reagent and reacts with the second reagent. The chemical reaction changes the properties of the portion of the polymeric layer which has been exposed to the chemical compound in a manner such that the solubility of this portion in respect to a developer solution is affected. For example, the exposed portion may become dissolvable in the developer solution or resistant to the developer solution.

An advantage of embodiments of the method described herein is that it does not require a UV exposure step to alter the chemical properties of the polymeric layer. A UV exposure step is used in alternative techniques, such as photolithography. In photolithography the polymeric layer contains a photosensitive layer and is referred to as photoresist. The photoresist must be exposed to the UV light through a shadowing mask. Photoresist solution can be toxic and generally have a high cost. Photolithography also requires a mask aligner and a UV source are required. This equipment has a high cost and a very low throughput.

The method described herein can be performed using less expensive equipment with a higher throughput, such as an ink-jet printer. Ink-jet printers can generally be used in a 'less clean' environment, whereas photolithography equipment is generally used in a clean room. In addition, using an ink-jet printer allows avoiding light scattering from the edge of the exposed area due to the edge of the mask.

Figure 1:
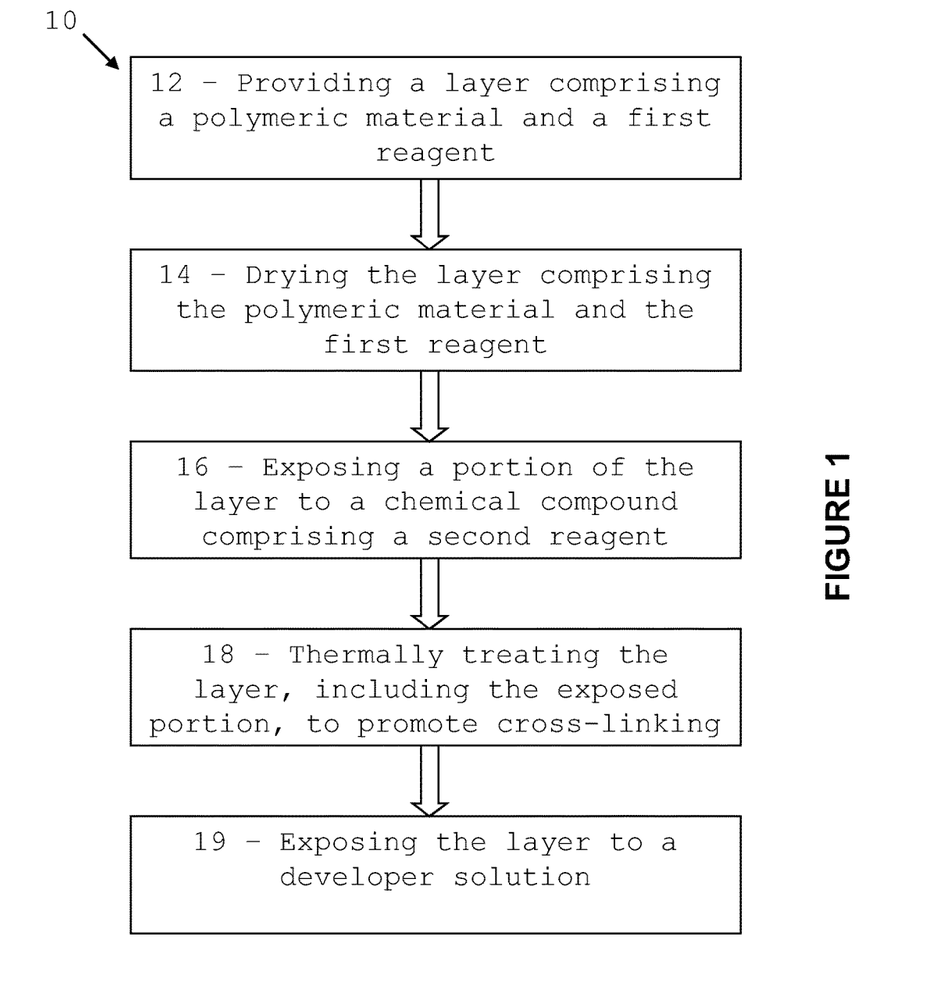
FIG. 1 is a flow diagram outlining the basic steps required to pattern a polymeric layer in accordance with embodiments.

Referring now to FIG. 1, there is shown a flow diagram 10 outlining a series of steps (12 to 19) required to pattern a polymeric layer in accordance with embodiments. At step 12, a layer comprising a polymeric material (polymeric layer) and a first reagent is provided. The polymeric layer may initially not contain any reagent and a regent (such as an HCl solution or citric acid with a PH~1), may be mixed to the polymeric layer. Depending on the application, the polymeric layer can be provided on a substrate and can be patterned to gain access to selected areas of a surface of the substrate. When the method is used to metallise a solar cell surface, the polymeric material may be deposited on a surface of a solar cell by spin coating. A possible spin coating time is 30 s at 1300 rpm. Other times and spinning velocities may be required for different polymeric materials. Alternatively, the polymeric material may be deposited on a substrate by, for example, dipping the substrate in a solution containing the polymeric material or applying a dry film of polymeric material onto the substrate.

The first reagent is generally added to the polymeric layer before the polymeric layer is deposited. This is done by mixing the polymeric material with the first reagent. Alternatively, the reagent may be added into the polymeric layer after the layer has been deposited.

At step 14, the layer comprising the polymeric material and containing the first reagent is dried to remove solvents. This step is optional and solvents may be removed simply by waiting for their evaporation. However, in a high throughput environment, the drying step 14 allows quicker processing. Drying step 14 can be performed, for example, by blowing air towards the polymeric layer for a period of time. Alternatively, step 14 may be substituted by a thermal treatment, such as a baking step, before the first reagent is added to the polymeric layer. In the embodiments where the polymeric material is pre-mixed with the first reagent in the fluid form, the baking step may be avoided as it may promote cross-linking of the polymeric material and affect the development step (19) of the polymeric layer.

At step 16, a portion of the polymeric layer is exposed to a chemical compound comprising a second reagent. The first and the second reagent react to change the chemical properties of the exposed portion of the polymeric layer. After the first and the second reagent react the exposed portion becomes soluble in the developer solution or resistant to the developer solution. In the first instance, after development, the area of the layer exposed to the chemical compound will have openings or grooves, depending on how deep the exposed portion extended in the layer. In the second instance the portion of the layer exposed to the chemical compound will resist the development process, while the remaining portion of the layer will be removed by the development solution. The difference between these two embodiments of the method is analogous to the concept of positive and negative photolithography.

In the embodiment described, the first and the second reagents have different hydrogen ion activity, or PH. More specifically the first reagent is an acidic reagent with a hydrogen ion activity between 1 and $10^{-4}$ and the second is a basic reagent with a PH of 8.6. The acidic reagent is an organic acidic solution with a volumetric concentration between 1 to 30 and 10 to 30. In some embodiments, the second reagent may be an acidic reagent with a PH between 4 and 7.

The chemical compound containing the second reagent is in the form of an ink and is deposited using an ink-jet printer onto a surface of the portion of the layer and penetrates the entire thickness of the layer. The chemical compound may be also deposited using an aerosol deposition technique or by screen-printing.

The penetration and mixing of the basic ink with the acidic polymeric material is promoted by a plasticiser contained in the ink. The plasticiser improves mixing of the chemical compound throughout the thickness of the layer. In some instance the ink may also contain a surfactant for improving penetration of the chemical compound through the portion of the layer. Further, the ink may contain one or more buffering agents for improving the efficiency of the reaction between the polymeric material and the second reagent.

At step 18, the polymeric layer is thermally treated to promote cross-linking of the portion which has not been exposed to the ink. Different temperatures and time intervals can be used depending on the chemical composition of the polymeric layer.

One of the applications of the thermal treatment is to promote the chemical crossing-linking reaction. For this application a temperature of about 110° C. is used for 1 min treatment time. Generally, temperature below 100° C. result in higher development rates of non-printed areas. Treatment temperatures higher than 140° C. may results in cross-linking of the printed areas.

At step 19, the polymeric layer is exposed to a developer solution for 1 minute and 15 seconds. The developer solution is a MIF developer solution. Different developer solutions and time intervals may be used depending on the nature of the polymeric layer.

Referring now to FIGS. 2A to 2G there are shown schematic illustrations (200, 206, 210, 214, 218, 222, and 226) of a solar cell device at different stages of a metallisation process performed using the method 10.

Figure 2A:
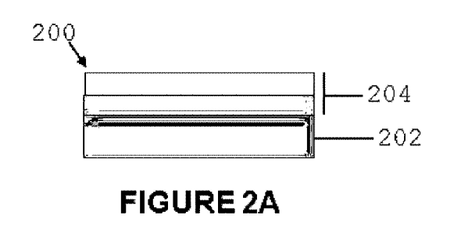
FIGS. 2A to 2G are schematic illustrations of a solar cell device at different stages of a metallisation process performed in accordance with an embodiment.

Device 200 comprises a silicon substrate 202 and one or more layers on the substrate 202 which form a solar cell. In FIG. 2 these one or more layers are represented as two layers 204. The number of layers is not limited to two and the polymeric layer may be deposited on an active layer of the solar cell, a semiconducting layer, a dielectric layer or a conductive layer.

Figure 2B:
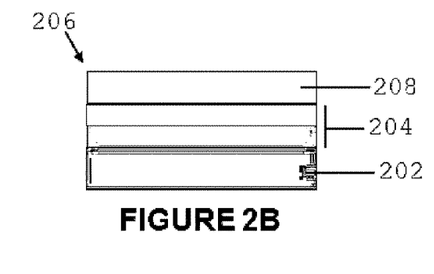

FIG. 2B shows a polymeric layer 208 deposited on the top surface of device 206 by spin coating for 30 seconds at 1300 rpm. Polymeric layer 208 comprises a cross-linker molecule and a resin arranged to cross-link to each other when exposed to sufficient thermal energy. The cross-linker molecule comprises melamine formaldehyde and the resin comprises a novolac polymer. Polymeric layer 208 is pre-mixed with an acid HCl solution or citric acid with a PH 1. The solution has a volume ration of 1:30. A different PH and different concentrations may be used with different polymeric materials.

Figure 2C:
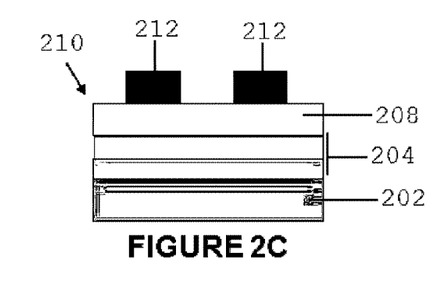

FIG. 2C shows a layer of a basic ink 212 with a PH of 8.6 deposited in accordance with a predetermined pattern on the surface of layer 208. The ink layer 212 is deposited using an inkjet printer.

Upon depositing the ink layer 212 on the polymeric layer 208, the acid in the polymeric layer 208 and the basic ink 212 start reacting in a manner such that the portions of the cross-linking of the portions of the polymeric layer 208 exposed to the ink 212 is minimised. The mixing of the polymeric layer 208 and the ink 212 are promoted by a plasticiser contained in the ink. The ink may also contain a buffering agent and surfactant agents. The cross-linking of the unexposed portions of the polymeric layer 208 is promoted by baking the solar cell for 1 minute at 110° C.

Figure 2D:
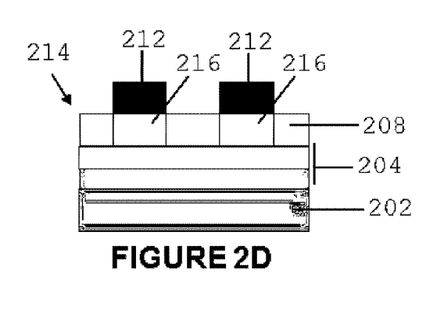

FIG. 2D shows portions 216 of the polymeric layer 208 which have reacted with the ink.

Figure 2E:
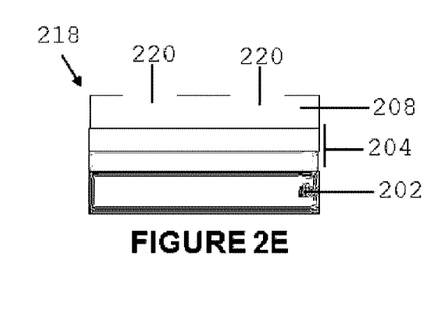

FIG. 2E shows device 218 after development. The device has been immersed in a solution of MIF 826 developer for 1 minute and 15 seconds. Device 218 has openings 220 in the polymeric layer 208, the openings are formed by the developer solution which has removed the portion of the polymeric layer which was exposed to the ink.

Once the polymeric layer 208 is patterned, it can be used for several applications. In the case of device 222 of FIG. 2F, the polymeric layer is used as a metallisation mask for a metallic layer 224. The metallic layer is evaporated across the entire solar cell 222. However, when the remaining cross-linked portion of the polymeric layer is chemically removed, portions of the metallic layer 224 are lifted-off and a patterned metallic layer 224 is left on the top surface of the solar cell, as shown in device 226 of FIG. 2G.

Figure 2F:
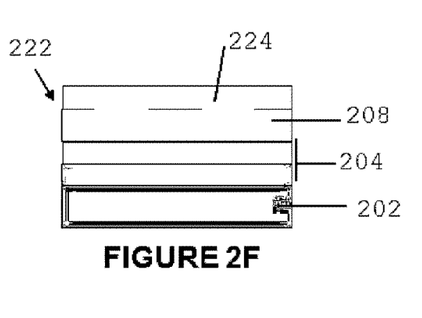
Figure 2G:
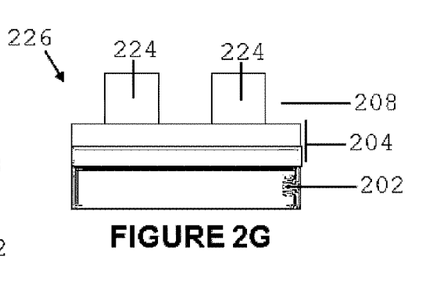

The actual steps of method 10 used to pattern polymeric layer 208 for the manufacturing of a solar cell device are shown in FIGS. 2A to 2E. FIGS. 2F and 2G show device 222 when a metallic layer is applied on the patterned polymeric layer. This can be done, for example, by metal evaporation. When the polymeric layer is chemically removed, it lifts-off portions of the evaporated metallic layer, as shown in device 226. In alternative embodiments, the metallisation of the solar cell surface through the openings of the patterned polymeric layer may be performed using other methods, such as light-induced anodisation or plating. In this case the metallic material is only formed in the openings of the polymeric layer.

Further, patterned polymeric layer 208 in FIG. 2E may be used to selectively etch a surface of a solar cell device to create a template. This may be used, for example, to prepare the surface for further processing or to implement a light trapping technique. If an aggressive chemical etching technique is used, or a plasma etching technique, the polymeric layer 208 can be hard-baked prior to the etching step. Hard baking the polymeric layer 208 improves the bonds of the polymeric material providing a reliable masking effect for the solar cell surface.

Figure 3A:
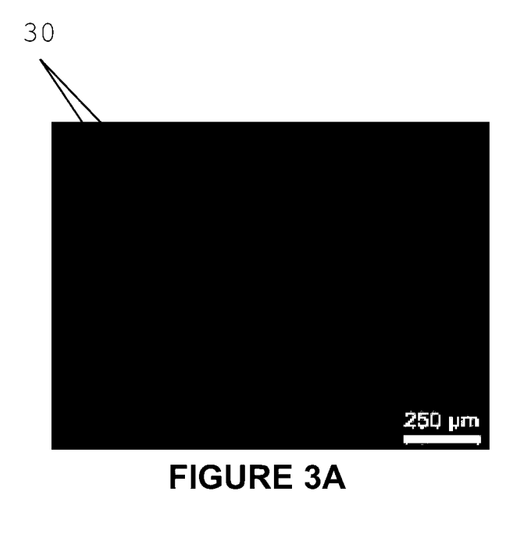
FIGS. 3A and 3B are microscopy images of a surface of a semiconductor wafer metallised using a method in accordance with an embodiment.
Figure 3B:
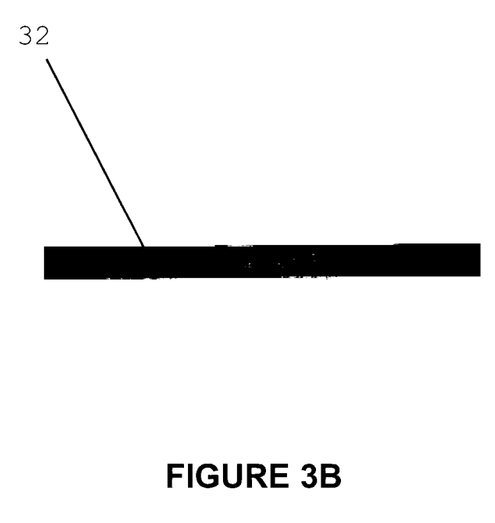

Referring now to FIG. 3, there is shown a microscopy image of a series of parallel metal lines 30 realised on the surface of a semiconductor wafer using the method described above. A line width of about 20 micrometers can be achieved using the experimental parameters discussed. A detail of a single metal line 32 is shown in FIG. 3B. After plating and resist removal, metal lines with a width of 23 micrometers and a height of 10 micrometers are achieved.

Figure 4A:
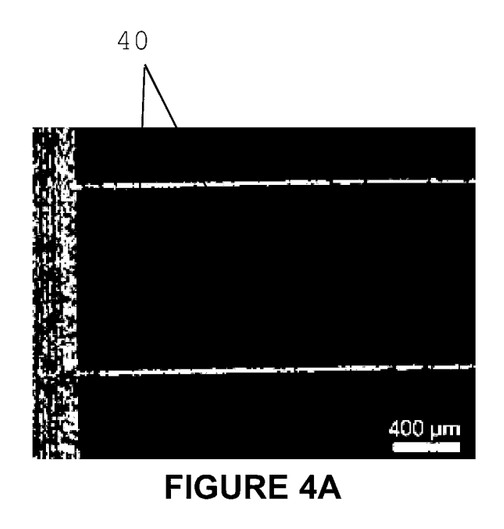
FIGS. 4A and 4B are microscopy images of metal fingers of a solar cell manufactured using a method in accordance with an embodiment.
Figure 4B:
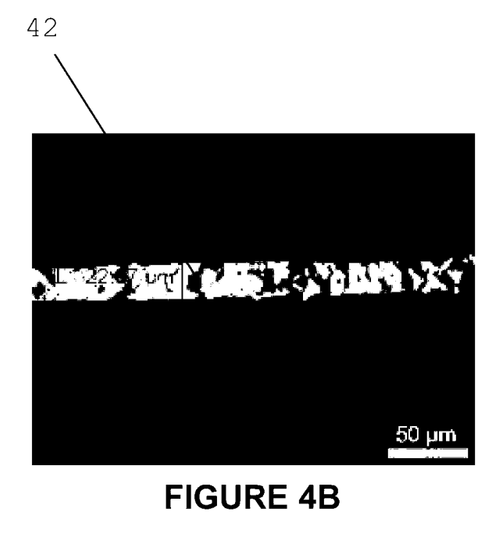

FIG. 4 shows microscopy images and of metallic lines ('fingers') 40 and 42 formed on the top surface of a commercial solar cell using the method of FIG. 1.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

The claims as defined in the invention are as follows:

1. A method of patterning a polymeric layer, the method comprising the steps of:
   providing a layer comprising a polymeric material and a first reagent;
   exposing a portion of the layer to a chemical compound comprising a second reagent; and thereafter
   exposing the layer to a developer solution;
   wherein the first reagent of the layer reacts with the second reagent of the chemical compound to alter the chemical properties of the exposed portion of the layer in a manner such that the solubility of the polymeric material in the developer solution at the exposed portion is increased or decreased.

2. The method in accordance with claim 1 wherein the polymeric material at the exposed portion of the layer is substantially dissolvable in the developer solution or substantially resistant to the developer solution.

3. The method in accordance with claim 1 wherein the method further comprises the step of processing the polymeric layer so that the chemical properties of a portion of the layer that has not been exposed to the chemical compound comprising the second reagent are altered in a manner such that the solubility of the polymeric material in the developer solution is increased or decreased.

4. The method in accordance with claim 3 wherein the step of processing the polymeric layer comprises the step of baking the layer at a temperature between 90° C. and 150° C.

5. The method in accordance with claim 3 wherein the step of processing the polymeric layer comprises the step of baking the layer for a period of time between 10 seconds and 3 minutes.

6. The method in accordance with claim 3 wherein the step of processing the polymeric layer comprises the step of baking the layer for a period longer than 3 minutes and wherein the duration of the baking treatment is related to whether the layer is used as an etching mask or as a plating mask.

7. The method in accordance with claim 1 wherein the step of exposing a portion of the layer to a chemical compound comprising a second reagent comprises the step of depositing the chemical compound onto a surface of the portion of the layer.

8. The method in accordance with claim 1 wherein the chemical compound comprises an ink comprising the second reagent.

9. The method in accordance with claim 8 wherein the step of depositing the chemical compound onto a surface of the portion of the layer is performed using an ink-jet deposition technology, an aerosol deposition technique or a screen-printing technique.

10. The method in accordance with claim 1 wherein the portion of the layer extends throughout the entire thickness of the layer.

11. The method in accordance with claim 1 wherein the portion of the layer defines a solar cell metallization pattern comprising a plurality of elongated openings in the layer.

12. The method in accordance with claim 1 wherein the first reagent is an acidic reagent with a hydrogen ion activity between 1 and $10^{-4}$ and the second reagent has a hydrogen ion activity between $10^{-4}$ and $10^{-14}$.

13. The method in accordance with claim 12 wherein the layer comprises a photoresist material or a chemically amplified photoresist material.

14. The method in accordance with claim 13 wherein the step of providing a layer comprises the step of mixing the photoresist material with an acidic solution.

15. The method in accordance with claim 14 wherein the acidic solution is an organic acidic solution with a hydrogen ion activity between 1 and $10^{-4}$.

16. The method in accordance with claim 12 wherein the layer comprises a cross-linker molecule and a resin arranged to cross-link to each other when exposed to sufficient thermal energy.

17. The method in accordance with claim 12 wherein the chemical compound comprising the second reagent further comprises at least one of the following: a plasticiser for improving mixing of the chemical compound through the portion of the layer; a surfactant for improving penetration of the chemical compound through the portion of the layer; one or more buffering agents for controlling the PH and improve the efficiency of the reaction between the polymeric material and the second reagent; an organic solvent to promote chemical reaction with the layer comprising the polymeric material and precise PH control throughout the thickness of the layer.

18. The method in accordance with claim 1 wherein the first reagent is an acidic reagent and the second reagent is a basic reagent.

19. The method in accordance with claim 1 wherein the step of exposing the layer and the chemical compound to a developer solution comprises immersing the layer in a developer solution for a time period between 1 second and 300 seconds.

20. A method of forming a patterned metallic layer on a surface of a device, the method comprising the steps of:
    forming a layer comprising a polymeric material on the surface of the device;
    patterning a portion of the formed layer using the method in accordance with claim 1 to form one or more openings in the layer; and
    forming a metallic layer onto a first portion of the surface of the device through the one or more openings formed in the layer.

* * * * *